United States Patent [19]

Karga et al.

[11] 4,433,477

[45] Feb. 28, 1984

[54] KEYING BLOCK EXTRACTING TOOL

[75] Inventors: James D. Karga, Reynoldsburg; Harold E. McCullough, Blacklick, both of Ohio

[73] Assignee: Bell Telephone Laboratories, Incorporated, Murray Hill, N.J.

[21] Appl. No.: 321,585

[22] Filed: Nov. 16, 1981

[51] Int. Cl.[3] .................... H05K 3/32; H05K 13/04; H01R 43/00

[52] U.S. Cl. .................................... 29/764; 29/256; 29/283; 269/234; 269/246; 269/287; 294/86 R; 294/103 R

[58] Field of Search ................ 29/764, 762, 283, 256; 294/103 R, 86 R; 269/287, 234, 246, 243; 24/263 A, 263 R, 263 SW, 136 R, 136 B

[56] References Cited

U.S. PATENT DOCUMENTS 2,092,372 9/1937 Goeller .......................... 269/234 X 2,674,772 4/1954 Jacobs .......................... 24/263 A X 4,223,934 9/1980 Canceglia et al. ................ 29/764 X

*Primary Examiner*—Carl E. Hall

*Attorney, Agent, or Firm*—W. H. Kamstra

[57] ABSTRACT

An extracting tool (14 ) for extracting a keying block (12) having keying pins (13) extending outwardly therefrom from the terminal pins (11) of a backplane (10) of an interconnection system. A keying pin seizing mechanism is retained on a mounting card (27) dimensioned to fit between the rails 17 and 18 of a guide frame normally holding a circuit board. The seizing mechanism comprises a pair of adjacent vise blocks (15, 16) having aligned holes (19) to correspond to the locations of the keying pins (13). When the card (27) is fully inserted in the guide frame, the keying pins (13) of the keying block (12) pass through the aligned holes (19) of both vise blocks (15, 16). The latter blocks have opposing parallel faces (20, 21) lying at an angle to the axes of the keying pins (13). A finger operated screw mechanism (23, 24, 30) is provided to draw one vise block (15) against the other (16), a resultant force caused by the wedge action of the vise block parallel faces causing a slight lateral movement of one block (16). A slight shear stress is thus applied to the keying pins (13) to firmly grip them. The mounting card (27) along with the thus seized keying block (12) may then be withdrawn from the guide frame.

13 Claims, 3 Drawing Figures

KEYING BLOCK EXTRACTING TOOL

TECHNICAL FIELD

This invention relates to printed wiring boards and their mounting frames and particularly to tools and devices for handling various components of such apparatus during servicing, replacement, and the like.

BACKGROUND OF THE INVENTION

Printed wiring boards and their frames of the character described, for example, in U.S. Pat. No. 4,002,381 of D. R. Wagner et al., issued Jan. 11, 1977, are well-known in the art and have long provided an advantageous means for assembling and mounting relatively large numbers of electrical components. Typically, circuits extending from the components in the form of printed wiring on the board are extended to terminal contact areas arranged along a leading edge of the board. These terminal areas are spaced to mate with corresponding contact springs of a connector which may be mounted on the leading edge of the board. Suitable frames and racks are provided to support a number of the boards and also provide a means for guiding the boards so that their connectors may be accurately mated with terminal pins extending from a conventional backplane.

Not only must the board terminals be accurately and positively mated with the backplane pins, but the interconnection of the correct board and only the correct board with its pin field must be ensured. A power pin, for example, connected to the wrong board terminals could seriously damage the board electrical components and cause other costly damage. For this reason, a keying block is frequently interposed between the backplane and the circuit board connector. In one known backplane arrangement, such a block is fitted on terminal pins assigned thereto and has extending outwardly from the backplane, a number of keying pins uniquely positioned as a code for a particular circuit board. The connector of the latter board is provided with holes located to correspond to the unique positioning of the keying pins. As a result, only the correct circuit board connector can be fitted to the keying block pins and, therefore, to the correct backplane terminal pin field. All other circuit boards with connectors not having holes of the unique locations will be prevented from receiving the keying pins and, therefore, the wrong terminal pin field.

After its installation on a backplane assembly, it may become necessary on occasion to remove a keying block from its supporting terminal pins. The block may, for example, have been erroneously fitted, or it may have become damaged during the fitting of a circuit board. Before the installation of the circuit boards in their guide frames, a keying block may, if need be, be removed by hand. The very close spacing of adjacent boards in a fully assembled system, however, leaves insufficient room for such manual removal or replacement of a keying block. Manual access to a keying block would also not be recommended in view of the risk of inadvertently making contact with a powered backplane pin. It is thus the problem of gaining access to, removing, and replacing a keying block of a backplane to which the apparatus of the invention is chiefly directed.

SUMMARY OF THE INVENTION

The objectives of the invention are realized in one illstrative embodiment thereof comprising a tool which may be inserted in place of a circuit board to seize the keying pins of a keying block. The seizing mechanism, which is mounted on one end of a card dimensioned to fit the guide frames of the circuit boards, comprises a pair of adjacent vise blocks having aligned holes to correspond to all of the combinations of the unique positions of the keying pins. When the card is fully inserted in the guide frame of a circuit board, the keying pins of a keying block pass through the aligned holes of both vise blocks. The latter blocks are maintained slightly spaced apart by spring action and present opposing parallel faces lying at an angle less than 90 degrees from the axes of the keying pins. A first of the vise blocks initially entered by the keying pins has a threaded hole into which a threaded rod is screwed, the rod extending freely through the adjacent vise block to the other end of the mounting card where the rod terminates in a knurled finger wheel. A turn of the finger wheel draws the angled faces of the two vise blocks into contact thereby causing lateral movement of the second vise block with respect to the first due to the resultant force generated by the wedge action of the angled faces. This lateral movement in turn applies a slight shear stress on the keying pins which are thus firmly seized. The card may then be withdrawn from the circuit board guide frame. The latter frame ensures the accurate alignment of a keying block with the backplane terminal pins during replacement.

BRIEF DESCRIPTION OF THE DRAWING

The organization and operation of a keying block extracting tool according to the principles of the invention will be better understood from a consideration of the detailed description of one illustrative embodiment thereof which follows when taken in conjunction with the accompanying drawing in which.

DETAILED DESCRIPTION

Figure 1:
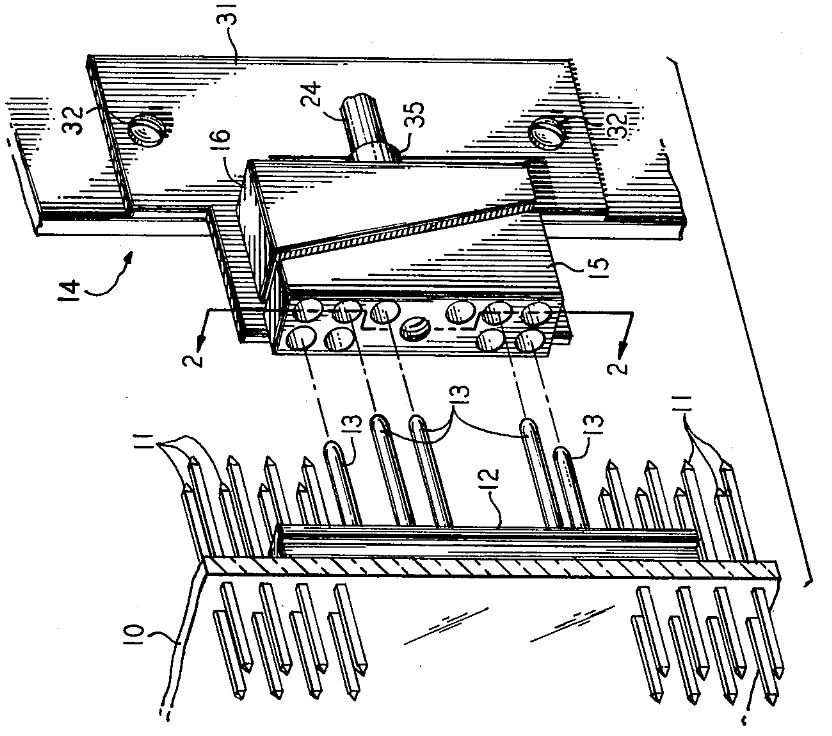
FIG. 1 depicts in perspective and partial section view, a backplane and its mounted keying block and the operative end of a portion of an illustrative extracting tool according to the invention.

A portion of a typical backplane 10 and its terminal pins 11 are shown in essential detail in the perspective view of FIG. 1 which also shows an oblique view of a conventional keying block 12 mounted on the backplane. At each end, block 12 is fitted over assigned terminal pins 11 (see also FIGS. 2 and 3) and has extending outwardly therefrom a plurality of keying pins 13 uniquely spaced and positioned in accordance with the coding of a circuit board designated for connection to the backplane at that point. Also in FIG. 1 is shown the operative end of an extracting tool 14 according to the invention in alignment with keying pins 13 of block 12. The end of extracting tool 14 shown carries a pin seizing mechanism comprising a pair of vise blocks 15 and 16 having aligned holes spaced and positioned to receive any unique spacing and positioning of keying pins 13 of keying block 12. Pins 13 pass through both vise blocks 15 and 16 when tool 14 is fully inserted between the guide frames of an absent circuit board as more clearly seen in FIG. 2 which figure will now be referred to.

Figure 2:
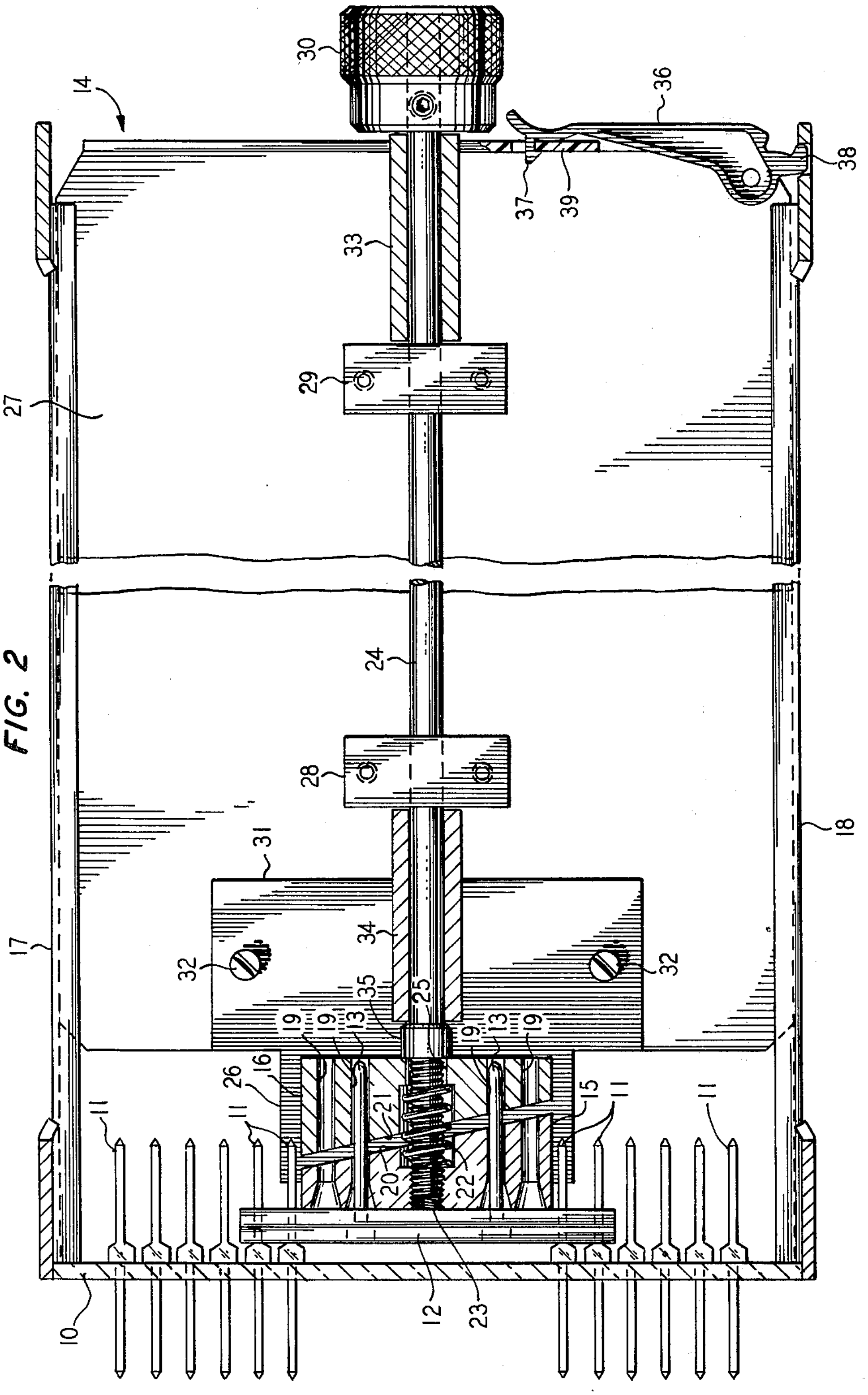
FIG. 2 is a partial section view of the extracting tool of FIG. 1 taken along the line 2—2 in the direction indicated, the tool being shown in place between circuit board guide frames before its operation to extract a keying block.

FIG. 2 shows in greater detail the sectional backplane 10 having conventional terminal pins 11 extended therethrough. Extending outwardly from backplane 10 is a guide frame comprising parallel retaining rails 17 and 18 spaced apart to receive a conventional circuit board normally fitted therebetween. Keying block 12 is retained on particular ones of terminal pins 11 by means of holes provided at the ends of block 12 and has two representative keying pins 13 extending outwardly therefrom. The latter pins are shown as fully inserted in aligned holes 19 of sectioned vise blocks 15 and 16. Holes 19 may be chamfered at the forward face of block 15 to facilitate entry of the keying pins. Vise blocks 15 and 16, which are preferably formed of a hard material such as steel, present opposing parallel faces 20 and 21, respectively, lying at an angle less than 90 degrees to the axes of keying pins 13. In practice, an angle of substantially 78 degrees was found suitable. Faces 20 and 21 are maintained slightly spaced apart by an internal coil spring 22. Vise block 15 is provided with a central threaded hole 23 adapted to receive the threaded end of a rod 24 which passes freely through coil spring 22 and an unthreaded central hole 25 in vise block 16.

The mechanism so far described is retained on a projection 26 at the forward end of a mounting card 27, shown broken in the drawing, which card is dimensioned in width to fit between guide frame rails 17 and 18 between which rails card 27 is shown fully inserted. A pair of mounting lugs 28 and 29, affixed to card 27 in any convenient manner, have aligned holes through which rod 24 is rotatably extended to the other end of card 27 where rod 24 terminates in a knurled finger wheel 30. At the forward end of card 27, a support plate 31, with which the inner sides of vise blocks 15 and 16 have slidable contact, is affixed to card 27 in any convenient manner such as by means of screws 32. Card 27 and its support plate 31 may be formed of any suitable material such as, for example, an epoxy glass laminate. Spacer sleeves 33 and 34, shown in section in the drawing, are freely fitted about rod 24 between lug 29 and finger wheel 30, and between lug 28 and a collar 35 on rod 24, respectively, to prevent any lateral movement of rod 24 with respect to mounting card 27. A typical latch mechanism 36 is provided to lock card 27 between rails 17 and 18 by means of a pair of detents 37 and 38 operating on a flange 39 of card 27, and a termination of rail 18, respectively, through apertures in the latter members as indicated in their sectioned portions.

Figure 3:
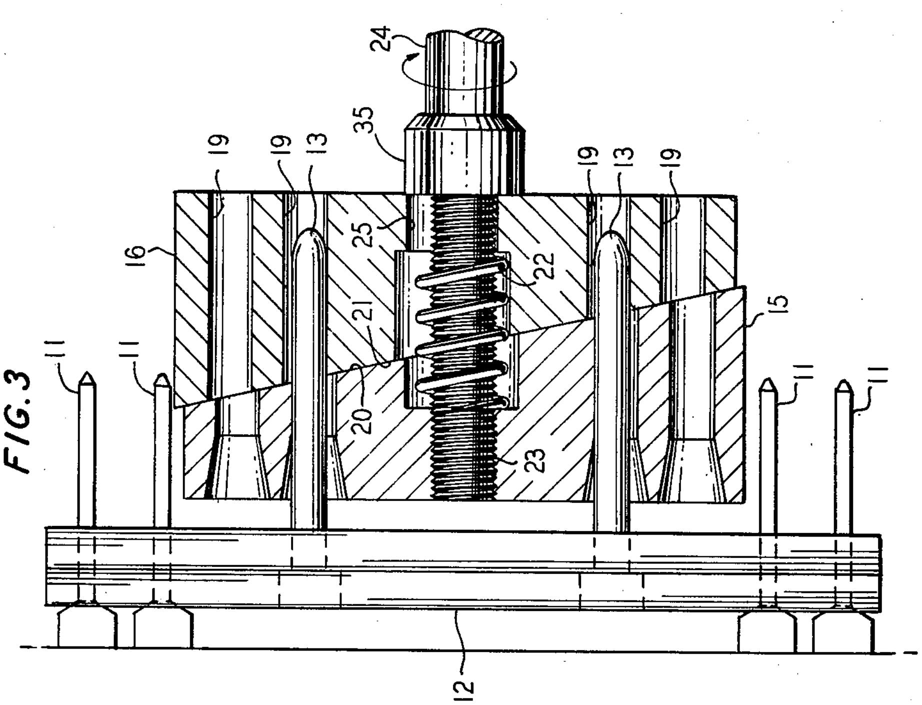
FIG. 3 is an enlarged section view of the pin seizing mechanism of the tool of FIGS. 1 and 2 depicted in its operative state in seizing the keying pins.

With the foregoing organization of one illustrative extracting tool according to the invention in mind, an illustrative operation thereof, and particularly that of its pin seizing mechanism, may now be considered with particular reference to the enlarged and exaggerated section view of FIG. 3. After extracting tool 14 has been fully inserted between rails 17 and 19 and latch 36 engaged (FIG. 2) keying pins 13 will also be fully inserted in the aligned holes 19 of vise blocks 15 and 16. At this time, finger 30 is rotated in a direction as determined by the direction of the threads at the other end of rod 24 to draw face 20 of vise block 15 into contact with face 21 of vise block 16 against the action of spring 22. Aligned holes 19 of the vise blocks are of sufficient diameter to freely admit keying pins 13 to permit the movement of vise block 15 along the axis of rod 24 toward its finger wheel end. Vise block 16 is prevented from movement in that direction by collar 35 and sleeve 34 acting against the stop of lug 28. A further rotation of finger wheel 30 in the same direction causes vise block 15 face 20 to apply a force to face 21 of vise block 16 parallel to the axes of pins 13 and rod 24. A resultant upward force as viewed in the drawing is, as a result, applied to vise block 16 due to the wedge action of inclined planar faces 20 and 21. As vise block 15 is forced upward, holes 19 of the two vise blocks are thrown out of alignment. Hole 25 of vise block 16 through which rod 24 passes is determined as of sufficient diameter to permit a slight lateral movement of vise block 16. As a result, keying pins 13 are firmly gripped by the shear stress applied by opposite sides of the now non-aligned holes 19 of the two vise blocks. Latch 36 (FIG. 2) may now be disengaged and card 27 and the seized keying block 12 withdrawn from between rails 17 and 18. When so withdrawn, a reverse rotation of finger wheel 30 releases vise block 16 to free keying pins 13. Vise blocks 15 and 16 are prevented from rotational movement during the foregoing operation by the sliding guidance of support plate 31. With a new keying block seized as described in the foregoing, its alignment with terminal pins 11 of the backplane is advantageously ensured by rails 17 and 18 of the guide frame.

Although the extracting tool of the invention was described in the foregoing in connection with the seizure of the keying pins of an interconnection system keying block and its extraction, it will be appreciated that the tool may be adapted to seize a pin or pins in other contexts where access to the pins is limited. What has been described is thus considered to be only one specific, illustrative extracting tool according to the principles of the invention. Accordingly, it is to be understood that various and numerous other arrangements may be devised by one skilled in the art without departing from the spirit and scope of the invention as limited only by the accompanying claims.

What is claimed is:

1. A pin seizing mechanism comprising: a pair of vise blocks having coaxial holes dimensioned to admit said pin through both said vise blocks, said vise blocks having opposing parallel faces lying at an angle less than 90 degrees from the longitudinal axes of said holes; and means for forcing said faces together to cause movement of one of said blocks with respect to the other of said blocks across said face of said other of said blocks to move said holes from a common axis to grip said pin when admitted through both said vise blocks.

2. A pin seizing mechanism as claimed in claim 1 in which said parallel faces lie at substantially 78 degrees from said longitudinal axes of said holes.

3. A pin seizing mechanism as claimed in claim 1 in which one of said vise blocks has a threaded hole therein and in which said means for forcing said faces together comprises a rod having threads at one end operating in said threaded hole, said rod passing freely through a hole in the other of said vise blocks; and stop means for preventing movement of said other of said vise blocks in a direction along the longitudinal axis of said rod.

4. A pin seizing mechanism as claimed in claim 2 also comprising a finger wheel at the other end of said rod for manually rotating said rod.

5. A pin seizing mechanism as claimed in claim 3 also comprising: a mounting card, said rod being rotatably mounted on said card, said card being dimensioned to fit between the rails of a circuit board guide frame of an electrical interconnection system.

6. An extracting tool for extracting a keying block having a plurality of keying pins outwardly extending therefrom from the terminal pins of a backplane of an electrical interconnection system, said tool comprising: a pair of vise blocks having coaxial holes located and dimensioned to admit said plurality of keying pins through both said vise blocks, said vise blocks having opposing parallel faces lying at an angle other than 90 degrees from the longitudinal axes of said holes, one of said vise blocks having a threaded hole therein, a rod having threads at one end operating in said threaded hole, said rod passing freely through a hole in the other of said vise blocks; stop means for preventing movement of said other of said vise blocks in a direction along the longitudinal axis of said rod; and mounting means for rotatably mounting said rod, rotation of said rod forcing said faces together to cause movement of said other of said vise blocks across said face of said one of said vise blocks to move said holes from their common axes to grip said keying pins when admitted through both said vise blocks.

7. An extracting tool as claimed in claim 6 in which said parallel faces lie at substantially 78 degrees from said longitudinal axes of said holes.

8. An extracting tool as claimed in claim 6 in which said mounting means comprises a mounting card dimensioned to fit between the rails of a circuit board guide frame of said electrical interconnection system.

9. An extracting tool as claimed in claim 6 or 7 also comprising a finger wheel at the other end of said rod for manually rotating said rod.

10. An extracting tool as claimed in claim 7 in which said mounting means further comprises a first and second spaced apart lug having aligned holes, said rod being rotatably extended through said last-mentioned holes, and in which said stop means comprises: a sleeve space rotatably fitted about said rod between said other vise block and said first lug.

11. An extracting tool as claimed in claim 9 also comprising a coil spring fitted about said rod between said vise blocks for normally maintaining said opposing parallel faces slightly spaced apart.

12. An extracting tool as claimed in claim 10 in which adjacent sides of said vise blocks are maintained in sliding contact with a face of said mounting card.

13. An extracting tool as claimed in claim 10 also comprising latch means for locking said mounting card to one of said rails of said guide frame.

* * * * *